United States Patent
Kim et al.

(10) Patent No.: US 12,165,046 B2
(45) Date of Patent: Dec. 10, 2024

(54) ENABLING HIERARCHICAL DATA LOADING IN A RESISTIVE PROCESSING UNIT (RPU) ARRAY FOR REDUCED COMMUNICATION COST

(71) Applicant: International Business Machines Corporation, Armonk, NY (US)

(72) Inventors: Seyoung Kim, Pohang (KR); Eun Kyung Lee, Bedford Corners, NY (US); Mingu Kang, Old Tappan, NJ (US); Seonghoon Woo, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 861 days.

(21) Appl. No.: 17/203,705

(22) Filed: Mar. 16, 2021

(65) Prior Publication Data

US 2022/0300797 A1    Sep. 22, 2022

(51) Int. Cl.
*G06N 3/047* (2023.01)
*G06N 3/065* (2023.01)
(Continued)

(52) U.S. Cl.
CPC ............ *G06N 3/065* (2023.01); *G06N 3/047* (2023.01); *G06N 3/08* (2013.01); *G11C 11/4063* (2013.01)

(58) Field of Classification Search
CPC .......... G06N 3/065; G06N 3/047; G06N 3/08; G11C 11/4063; G11C 11/54;
(Continued)

(56) References Cited

U.S. PATENT DOCUMENTS 5,388,010 A *   2/1995   Norton, Jr. .......... G11B 5/59611
9,843,339 B1    12/2017  Kuan et al.
(Continued)

FOREIGN PATENT DOCUMENTS

WO    WO-2004082175 A1 *  9/2004 .......... H04B 10/508
WO    WO 2017142542 A1    8/2017

OTHER PUBLICATIONS

WO-2004082175-A1 (Year: 2004).*
(Continued)

*Primary Examiner* — Ly D Pham
(74) *Attorney, Agent, or Firm* — Erik Johnson; Otterstedt & Kammer PLLC (57) ABSTRACT

An electronic circuit includes word lines; bit lines intersecting the word lines at a plurality of grid points; and resistive processing units located at the grid points. Baseline stochastic pulse input units are coupled to the word lines; differential stochastic pulse input units are coupled to the word lines; and bitline stochastic pulse input units are coupled to the bit lines. Control circuitry coupled to the pulse input units is configured to cause each of the baseline stochastic pulse input units to generate a baseline pulse train using base input data, each of the differential stochastic pulse input units to generate a differential pulse train using differential input data defining differences from the base input data, and each of the bitline stochastic pulse input units to generate a bitline pulse train using bit line input data. Neural network weights can thus be stored in the resistive processing units.

20 Claims, 8 Drawing Sheets

(51) Int. Cl.
*G06N 3/08* (2023.01)
*G11C 11/4063* (2006.01)

(58) Field of Classification Search
CPC ............ G11C 13/0026; G11C 13/0028; G11C 13/003; G11C 13/0069; G11C 13/0092
USPC ........................................................ 365/167
See application file for complete search history.

(56) References Cited

U.S. PATENT DOCUMENTS

| | | |
|---|---|---|
| 10,078,800 B2 | 9/2018 | Suri et al. |
| 10,217,046 B2 | 2/2019 | Eleftheriou et al. |
| 10,255,960 B2 | 4/2019 | Shimizu |
| 10,319,439 B1 | 6/2019 | Li et al. |
| 10,664,745 B2 | 5/2020 | Gokmen et al. |
| 2014/0172937 A1 | 6/2014 | Linderman et al. |
| 2017/0109626 A1 | 4/2017 | Gokmen et al. |
| 2018/0225567 A1 | 8/2018 | Bedell et al. |
| 2019/0164605 A1 | 5/2019 | Jeong et al. |
| 2019/0354847 A1 | 11/2019 | Rasch et al. |
| 2020/0027505 A1 | 1/2020 | Lee et al. |
| 2020/0118626 A1 | 4/2020 | Lee et al. |
| 2020/0211646 A1 | 7/2020 | Cho et al. |

OTHER PUBLICATIONS

Authorized Officer Silvia Scanavini, EPO as ISA, Related PCT Appln. PCT/EP2022/053908, ISR and Written Opinion of the ISA, May 27, 2022, 12 pages total.

Babu et al.; "Stochastic Learning In Deep Neural Networks Based On Nanoscale PCMO Device Characteristics", Neurocomputing, vol. 321, pp. 227-236, Dec. 10, 2018.

Sze et al.; "Efficient Processing Of Deep Neural Networks", massachusetts Institute Of Technology, pp. 1-82, Jun. 15, 2020.

Chen et al.; "Eyeriss v2: A Flexible Accelerator For Emerging Deep Neural Networks On Mobile Devices", ETCAS IEEE Journal On, vol. 9, Iss. 2, pp. 292-308, Jun. 2019.

Gokmen et al.; "Training LSTM Networks With Resistive Cross-Point Devices", Frontiers In Neuroscience, vol. 12, Article 745, pp. 1-10, Oct. 24, 2018.

Sun et al.; "A Memristor-Based Convolutional Neural Network With Full Parallelization Architecture", IEICE Electronics Express, vol. 16, No. 3, pp. 1-12, Jan. 18, 2019.

Li et al. "Capacitor-based cross-point array for analog neural network with record symmetry and linearity." 2018 IEEE Symposium on VLSI Technology. IEEE, 2018 2 Pages.

Tang et al. "ECRAM as scalable synaptic cell for high-speed, low-power neuromorphic computing." 2018 IEEE International Electron Devices Meeting (IEDM). IEEE, 2018 4 Pages.

Kim et al. "Analog CMOS-based resistive processing unit for deep neural network training." 2017 IEEE 60th International Midwest Symposium on Circuits and Systems (MWSCAS). IEEE, 2017 4 Pages.

Gokmen et al., Acceleration of Deep Neural Network Training with Resistive Cross-Point Devices: Design Considerations, Frontiers In Neuroscience, vol. 10, Article 333, pp. 1-13, Jul. 2016.

Gokmen et al., Training Deep Convolutional Neural Networks with Resistive Cross-Point Devices, Frontiers In Neuroscience, vol. 11, Article 538, pp. 1-13, Oct. 2017.

Korean Intellectual Property Office Request for the Submission of an Opinion, Related PCT Korean Appl. 10-2023-7029108, Aug. 12, 2024, 4 pages total (English Translation).

* cited by examiner

ENABLING HIERARCHICAL DATA LOADING IN A RESISTIVE PROCESSING UNIT (RPU) ARRAY FOR REDUCED COMMUNICATION COST

BACKGROUND

The present invention relates to the electrical, electronic, and computer arts, and more specifically, to electronic circuitry suitable for implementing neural networks and the like.

Neural networks have increased in popularity for a variety of applications. Neural networks are used to carry out machine learning. A computer learns to perform some task by analyzing training examples. Typically, the examples have been hand-labeled in advance by a human expert. A neural network includes thousands or even millions of simple processing nodes that are densely interconnected. Training of neural networks, and inference using trained neural networks, is computationally expensive. Indeed, data sets required to train large-scale, parallel neural networks requires more and more input data, exceeding on the order of Terabytes (TB) in size.

Hardware-based techniques have been proposed to address the computational challenges associated with neural networks; for example, resistive processing unit (RPU) devices that can potentially accelerate neural network training by orders of magnitude while using much less power. However, even in fast RPU operations, input data communication cost via wireless communication or off-chip interface is still a significant overhead burden in many applications, e.g., deep neural network training and the like.

SUMMARY

Principles of the invention provide techniques for enabling hierarchical data loading in a resistive processing unit (RPU) array for reduced communication cost. In one aspect, an exemplary electronic circuit includes a plurality of word lines; a plurality of bit lines intersecting the plurality of word lines at a plurality of grid points; a plurality of resistive processing units located at the plurality of grid points; a plurality of baseline stochastic pulse input units coupled to the plurality of word lines; a plurality of differential stochastic pulse input units coupled to the plurality of word lines; and a plurality of bitline stochastic pulse input units coupled to the plurality of bit lines. Also included is control circuitry coupled to the plurality of baseline stochastic pulse input units, the plurality of differential stochastic pulse input units, and the plurality of bitline stochastic pulse input units and configured to cause each of the baseline stochastic pulse input units to generate a baseline pulse train using base input data, each of the differential stochastic pulse input units to generate a differential pulse train using differential input data defining differences from the base input data, and each of the bitline stochastic pulse input units to generate a bitline pulse train using bit line input data.

In another aspect, a hardware description language (HDL) design structure is encoded on a machine-readable data storage medium, and the HDL design structure includes elements that when processed in a computer-aided design system generates a machine-executable representation of an apparatus. The HDL design structure includes an electronic circuit as just described.

In still another aspect, an exemplary method includes providing an electronic circuit as just described, and, with the control circuitry, causing each of the baseline stochastic pulse input units to generate a baseline pulse train using base input data, each of the differential stochastic pulse input units to generate a differential pulse train using differential input data defining differences from the base input data, and each of the bitline stochastic pulse input units to generate a bitline pulse train using bit line input data.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in hardware such as digital circuitry. This digital circuitry can then be used in a computer to train/execute machine learning software in a computationally efficient manner. The machine learning software can be implemented in the form of a computer program product including a computer readable storage medium with computer usable program code for performing the method steps indicated. The software can then be executed on a system (or apparatus) including a memory, and at least one processor that is coupled to the memory and operative to perform exemplary machine learning training and inference; the processor can be configured as described herein.

Techniques of the present invention can provide substantial beneficial technical effects. For example, one or more embodiments provide:

significant reduction in input data communication cost for training large-scale, parallel neural networks and the like;

unlike other compression techniques to decrease the input data volume, explicit decompression operation is not required; and/or input data volume is highly reduced as the consecutive frames of data have high similarity.

These and other features and advantages of the present invention will become apparent from the following detailed description of illustrative embodiments thereof, which is to be read in connection with the accompanying drawings.

DETAILED DESCRIPTION

As noted, even in in fast RPU operations, input data communication cost is still a major overhead burden. One or more embodiments advantageously permit an acceleration of same on the order of 10,000× compared to conventional digital accelerator hardware. One or more embodiments make use of the fact that there are many data sets of interest exhibiting high data-to-data similarities. These include, by way of example and not limitation, frames in molecular dynamics (MD) simulation data and pattern recognition in video frames with continuously moving objects. One or more embodiments advantageously divide input data (during pre-processing) into baseline data and difference data to eliminate similarities and reduce input data size. While dividing input data into baseline data and difference data is known per se, one or more embodiments provide further improvements by efficient implementation in the RPU context without the need to explicitly recover the original data.

Instead of using one stochastic pulse generator, however, one or more embodiments use two stochastic pulse generators (baseline and difference) for the input layer rows. In one or more embodiments, the base data is transferred occasionally, while the difference data is transferred with a reduced number of bits. This advantageously allows significant reduction in the communication cost (up to 75% reduction compared to RPUs that do not apply this technique). Since the base data and difference data are typically not calculated in the digital domain, there is no additional computation hardware/cost required.

Figure 1:
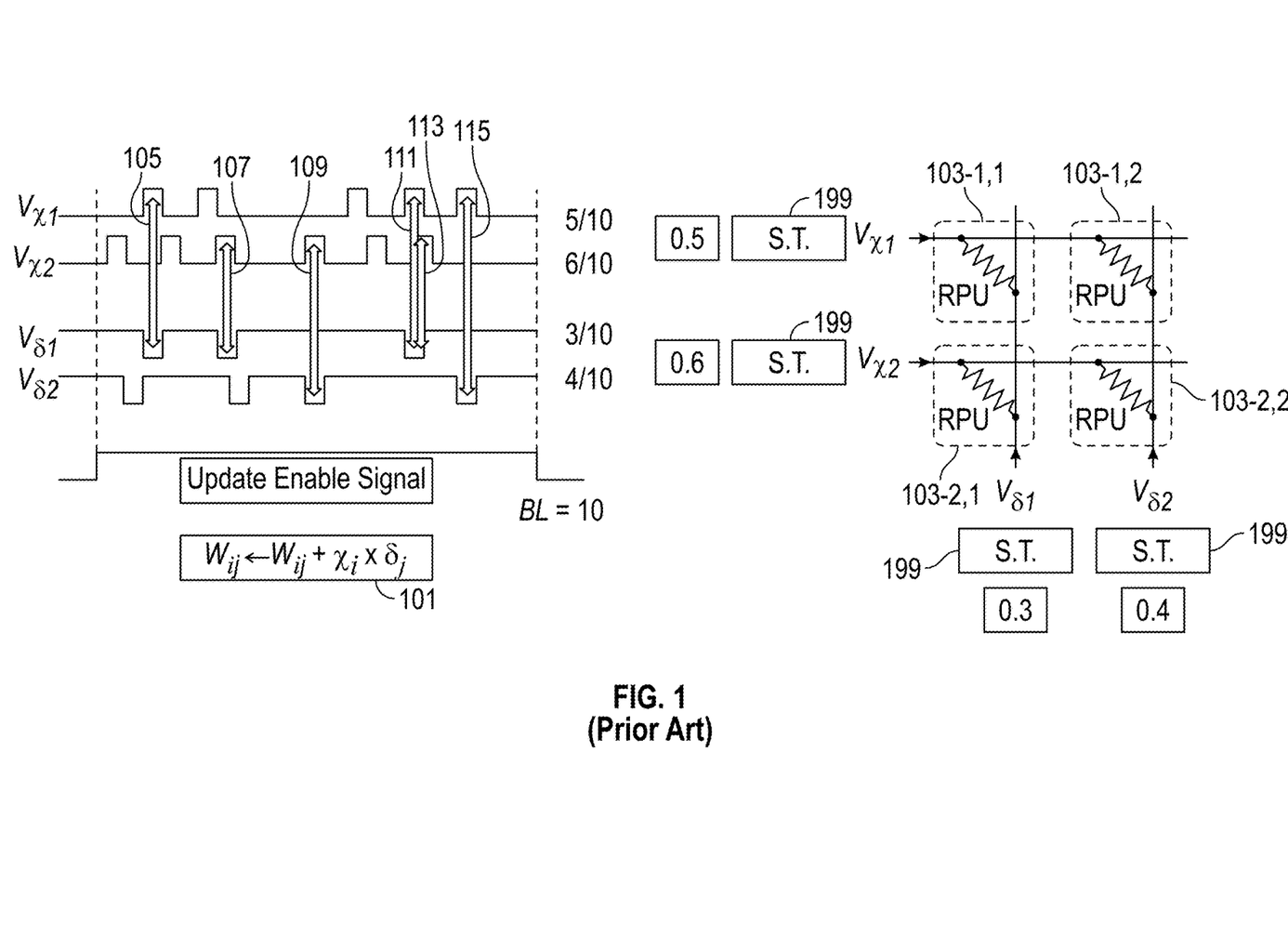
FIG. 1 depicts shows a prior art technique for applying a stochastic update rule to an RPU-based array.

Furthermore in this regard, FIG. 1 shows a prior art technique for applying a stochastic update rule to an RPU-based array. In the update cycle, all the RPUs in the array can be updated in parallel, independent of array size. Stochastic bit streams are used to encode the numbers. Overlapping the signal(s) will update the weight in an incremental fashion. Referring to equation 101, the weight change is proportional to $x_i \times \delta_j$ on average ($w_{ij}$ is the weight value for the $i^{th}$ row and $j^{th}$ column, $x_i$ is the activity at the input neuron, and $\delta_j$ is the error computed by the output neuron. The update time is proportional to BL (Length of the stochastic bit stream at the output of the stochastic translators 199). Switching of an RPU device 103-1,1, 103-1,2, 103-2,1, 103-2,2 in the matrix occurs only when the positive and negative pulses coincide. Thus, arrow 105 represents a first update of device 103-1,1; arrow 107 represents a first update of device 103-2,1; arrow 109 represents a first update of device 103-2,2; arrow 111 represents a second update of device 103-1,1; arrow 113 represents a second update of device 103-2,1; and arrow 115 represents a first update of device 103-1,2. The probabilities of the voltages $V_{x1}$ and $V_{x2}$ to toggle to high are 0.5 and 0.6, respectively. Thus, $V_{x2}$ has more high pulses than $V_{x1}$ during the total update duration=10. Similarly, the probabilities of the voltages $V_{\delta 1}$ and $V_{\delta 2}$ to be low are 0.3, and 0.4 as labeled in decimal form on the right side of FIG. 1 and indicated in fractional form as indicated to the right of the arrows 105-115.

Figure 2:
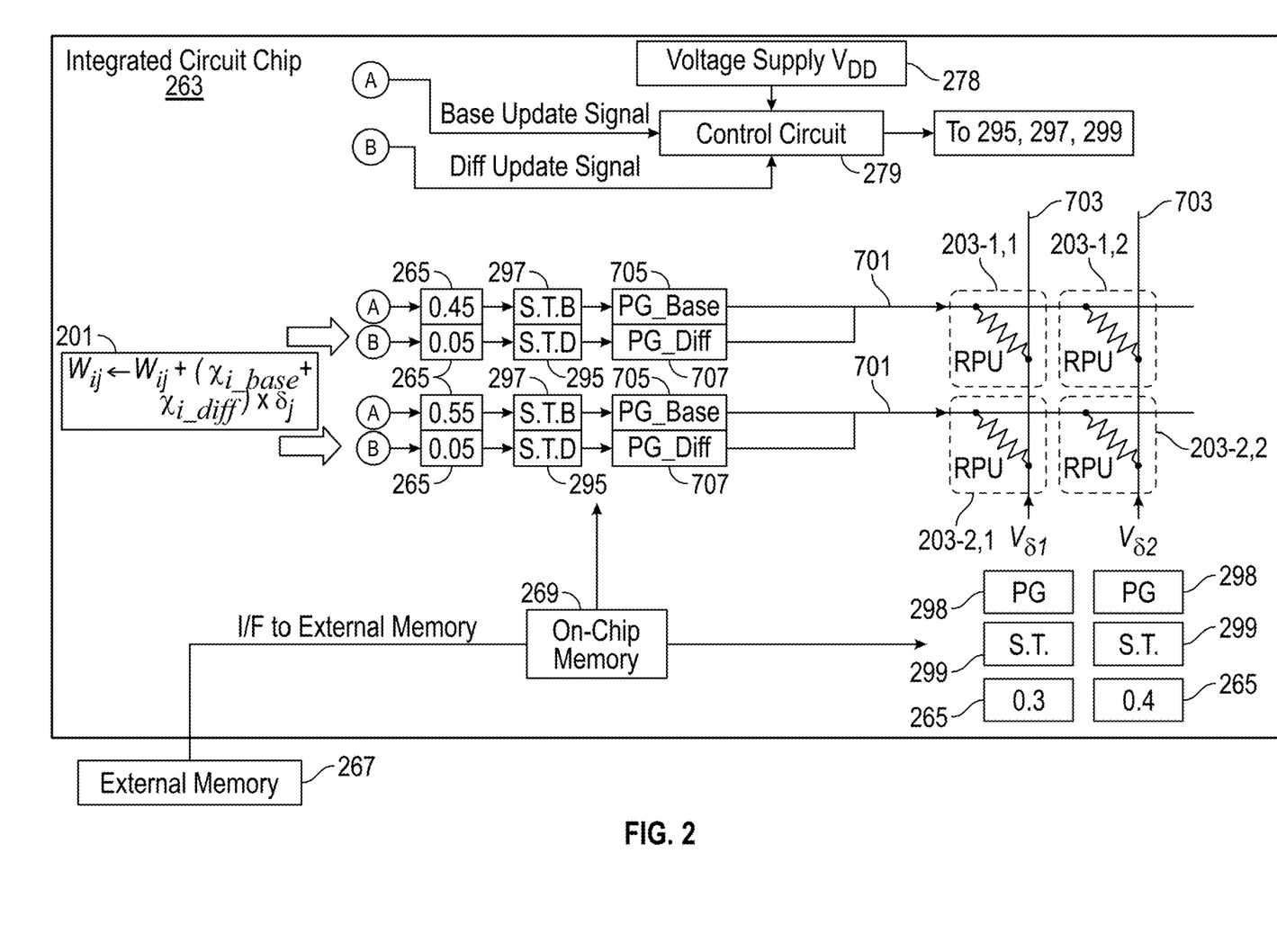
FIG. 2 depicts a technique for applying a stochastic update rule to an RPU-based array, according to an aspect of the invention.
Figure 3:
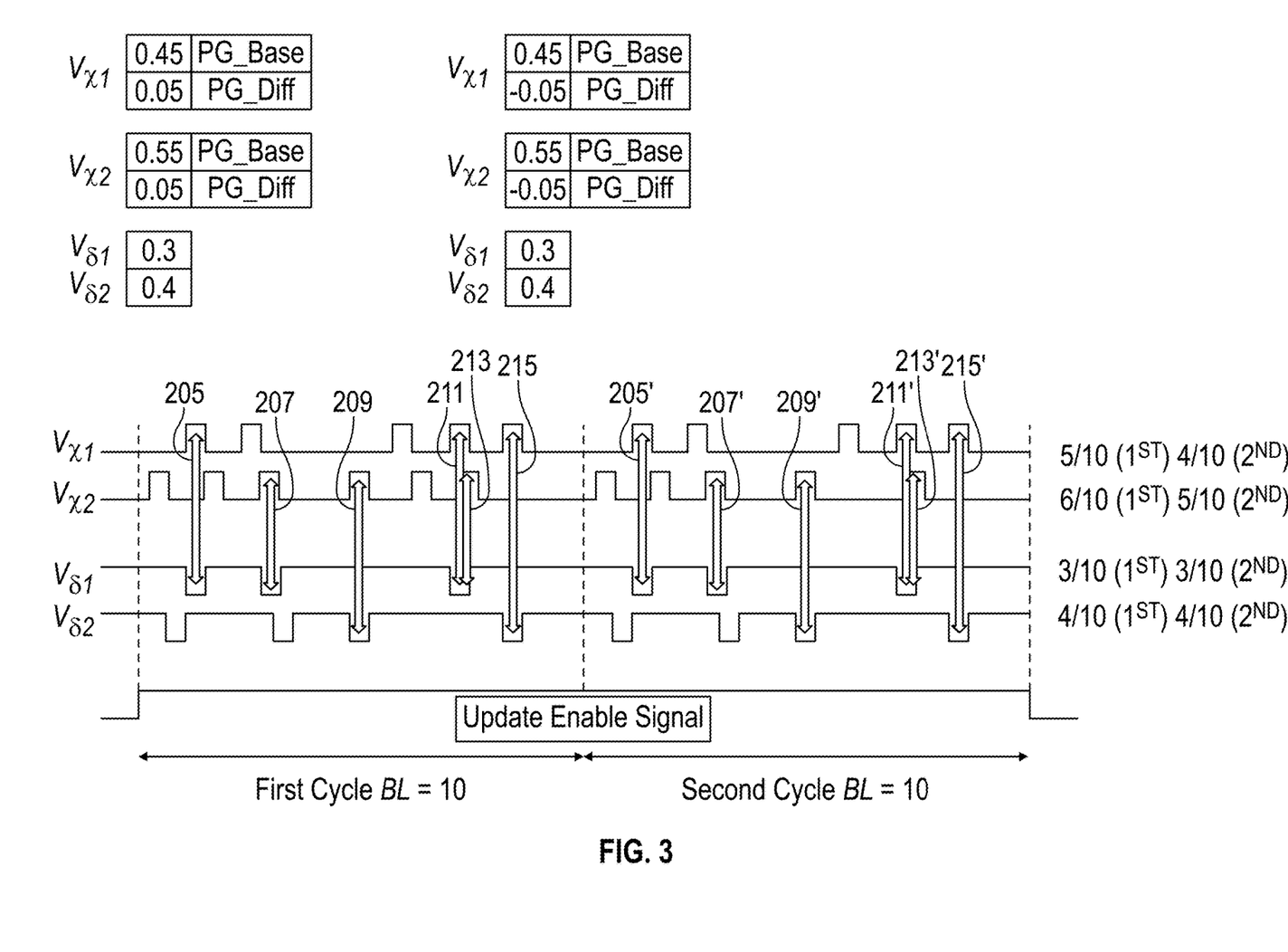
FIG. 3 shows two exemplary cycles of update for the array of FIG. 2, according to an aspect of the invention.

FIGS. 2 and 3 show an exemplary embodiment of the invention wherein dual pulse generators are employed for each row in the first neural network layer. The "diff" data is received every cycle while the base data need only be received every $n^{th}$ cycle. As in FIG. 1, overlapping the signal(s) will update the weight in an incremental fashion. Referring to equation 201, the weight change here is proportional to $(x_{i\_base} + x_{i\_diff}) \times \delta_j$ on average ($w_{ij}$ is the weight value for the $i^{th}$ row and $j^{th}$ column, $x_{i\_base}$ is the base portion of the activity at the input neuron, $x_{i\_diff}$ is the differential portion of the activity at the input neuron, and $\delta_j$ is the error computed by the output neuron).

Note word lines (WL) 701 (only two are shown to avoid clutter) and bit lines (BL) 703 (only two are shown to avoid clutter). In FIG. 2, each bit line includes a single stochastic translator 299 while each word line 701 includes two stochastic translators; namely, a "base" (B) stochastic translator 297 and a "diff" (D) stochastic translator 295.

The update time is proportional to BL (Length of the stochastic bit stream at the output of the stochastic translators 295). Referring also to FIG. 3, two consecutive update cycles are depicted. Thus, in FIG. 3, the total duration of BL is 20 (2×10). FIG. 3 further shows an example where the diff values are changing across the cycles, and so the number of pulses also changes. Switching of an RPU device 203-1,1, 203-1,2, 203-2,1, 203-2,2 in the matrix occurs only when the positive and negative pulses coincide. Thus, arrow 205 represents a first update of device 203-1,1 with diff data during a first cycle; arrow 207 represents a first update of device 203-2,1 with diff data during the first cycle; arrow 209 represents a first update of device 103-2,2 with diff data during the first cycle; arrow 211 represents a second update of device 203-1,1 with diff data during the first cycle; arrow 213 represents a second update of device 203-2,1 with diff data during the first cycle; and arrow 215 represents a first update of device 203-1,2 with diff data during the first cycle. As explained elsewhere, the baseline data does not typically change every cycle but the diff data does.

In FIG. 2, the boxes 265 with the numbers (0.45, 0.05, 0.55, 0.05, 0.3, 0.4) represent temporary storage devices such as registers, i.e., baseline number 0.45 and also the diff number 0.05 are stored in registers. As appropriate, the baseline number register may have a relatively higher bit precision (e.g., 16 bit), and the diff number register may have a relatively smaller precision (e.g., 4 bit), because the diff numbers are usually very small compared to the baseline numbers. In one or more embodiments, rather than equipping any special enable signals, the register numbers will be updated periodically. In the example of FIG. 2, the diff number is updated every cycle, and the baseline number will be updated infrequently; the updates are managed by the controller 279. Note the "base update" signal connected to the boxes 265 with number 0.45 and 0.55 and the "diff update" signal connected to the other boxes 265 with number 0.05. The stochastic translators 295, 297 convert the input data in the registers 265 to a stochastic stream of high and low. Then, the stochastic pulse generators 705, 707 drive the WLs 701 based on the output of the stochastic translators (stream of high/low); i.e., not directly using the input data any more. Thus, the pulse generators do not use the base/diff input data per se, but rather the outputs of the stochastic translators. Stated in another way, as shown, the data A, B comes to the register, and then the translator uses the value to create a stream of high and low, and then the stream goes to the pulse generator, which drives the word lines (WL).

Furthermore, in FIG. 3, arrow 205' represents a first update of device 203-1,1 with diff data during a second cycle; arrow 207' represents a first update of device 203-2,1 with diff data during the second cycle; arrow 209' represents a first update of device 103-2,2 with diff data during the second cycle; arrow 211' represents a second update of device 203-1,1 with diff data during the second cycle; arrow 213' represents a second update of device 203-2,1 with diff data during the second cycle; and arrow 215' represents a first update of device 203-1,2 with diff data during the second cycle.

The probabilities of voltages $V_{x1}$, $V_{x2}$, being high are 0.5 (0.45+0.05), 0.6 (0.55+0.05), during the first cycle and the probabilities of voltages $V_{\delta 1}$, and $V_{\delta 2}$ being low are 0.3, 0.4, during the first cycle. This is shown in decimal form in FIG. 2 and in fractional form in FIG. 3. The probabilities of voltages $V_{x1}$, $V_{x2}$, being high are 0.4 (0.45−0.05), 0.5 (0.55−0.05), during the second cycle and the probabilities of voltages $V_{\delta 1}$, and $V_{\delta 2}$ being low are 0.3, 0.4, during the second cycle (see also fractional notation in FIG. 3).

Also shown in FIG. 2 are a conventional voltage supply 278, a control circuit 279, on-chip memory 269 (discussed further below) coupled to the registers 265, and an external memory 267 (discussed further below). Some or all of the components other than the external memory 267 can be implemented on an integrated circuit chip 263 (the voltage supply and/or control circuit could be off-chip if desired). Control circuit 279 carries out functions as defined herein; given the teachings and description of the functions herein, known control circuit technologies can be employed; e.g., multicycle or pipelined, hardwired or microprogrammed, using any suitable technology family (e.g., 7 nm CMOS, 5 NM CMOS, and the like). For example, the specified functions can be instantiated in logic circuitry as described below with respect to FIG. 9.

Figure 4:
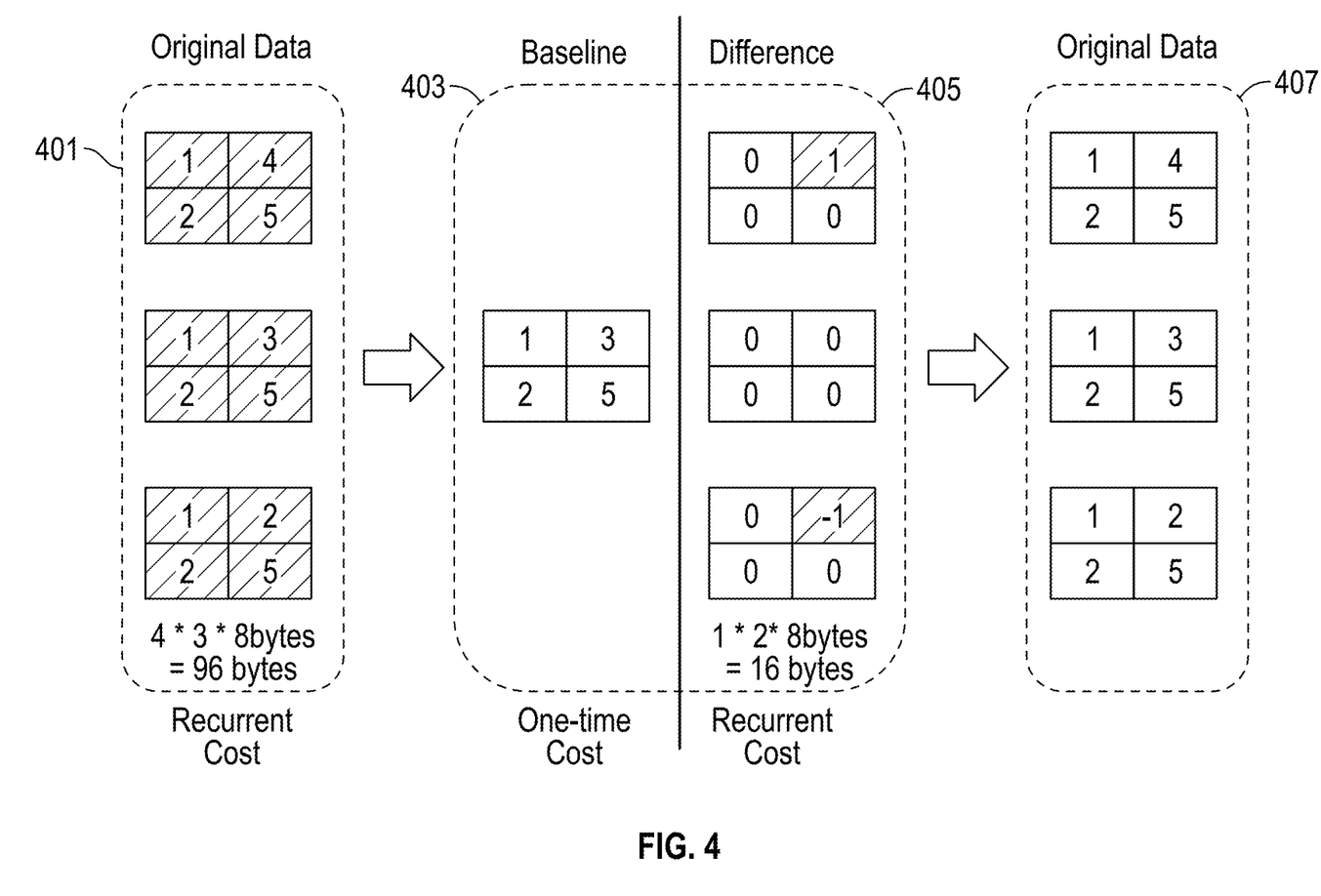
FIG. 4 shows examples of baseline and difference data, according to an aspect of the invention.

FIG. 4 shows examples of the baseline and difference data. The original data is shown at 401. It is divided into baseline data 403 and difference data 405. When the difference data is added to the baseline data, the original data is reproduced at 407. If it is assumed that copying the baseline is negligible, the total overhead for copying the original data (96 bytes) for an exemplary embodiment of the invention will be 16 bytes ((16/96)*100=17%) by neglecting the one-time baseline data overhead. Furthermore in this regard, the volume of training data in the applications is typically very large, so that the data typically needs to be moved from external large storage devices such as solid-state drives (SSDs) to on-chip memory (random access memory (RAM)) via an off-chip interface or wireless communication. This communication cost is very expensive, and thus, one or more embodiments seek to minimize the communication cost. SSDs and RAM are a non-limiting example of such communication. A pertinent point is that in one or more embodiments, the baseline data copying is infrequent, so the communication cost for the baseline is negligible.

In one or more embodiments, eight bytes are assumed to represent a floating-point number. The baseline can be determined, for example, using heuristics or statistical methods (e.g., mean, median). The baseline data should typically be some representative data for a long period of time, e.g., if the full data across 3 cycles is 0.6->0.7->0.5, then the baseline data=0.6, and the difference data is 0->0.1->−0.1. Here, 0.6 is the mean value across the three values 0.6, 0.7, 0.5. "Mean and median" are the most widely used metrics to find representative values across many numbers. The baseline data 403 will be 32 bytes (4*8) while the difference data 405 will be 16 bytes (2*8). The baseline data of 32 bytes will be amortized if the n (number of difference frames before baseline changes i.e., the base data need only be received every $n^{th}$ cycle) is large enough. Thus, it can be assumed that the overhead of baseline data will be negligible when n is large enough (though the value of n=3 in this figure; i.e., three frames of difference data, this is for illustrative convenience but in an actual case the number should typically be much larger, say, >24). By assuming the baseline data overhead=0, the data can be sent with 16 bytes instead of 96 bytes (leading to the 17% value). Note that the value of 96 bytes is determined as follows: original data has three two-by-two arrays; 2*2=4; 4*3*8 bytes/floating point number=96 bytes. Furthermore, the difference data with sparse diff matrices is only the two elements in the diff matrices with non-zero values, time 8 bytes per floating point number, or 16 bytes.

Figure 5:
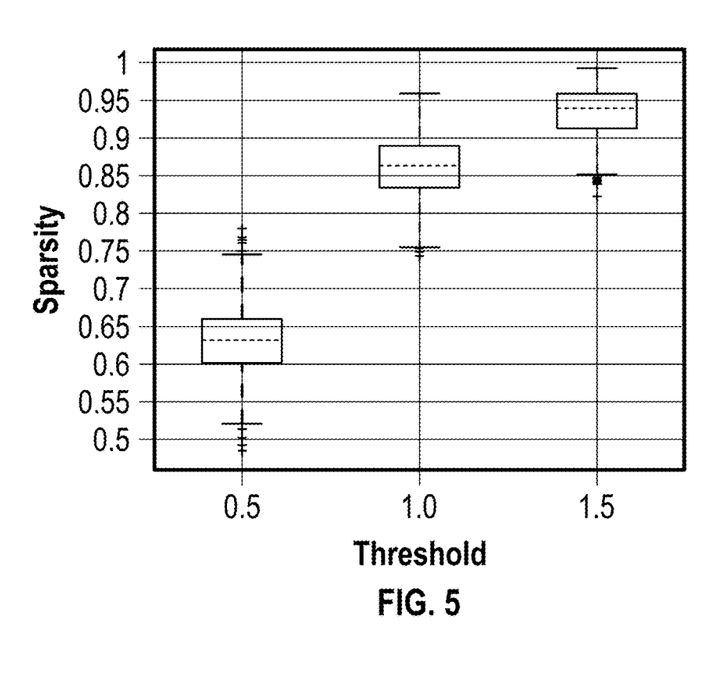
FIG. 5 shows exemplary data for sparsity versus threshold, according to an aspect of the invention.
Figure 6:
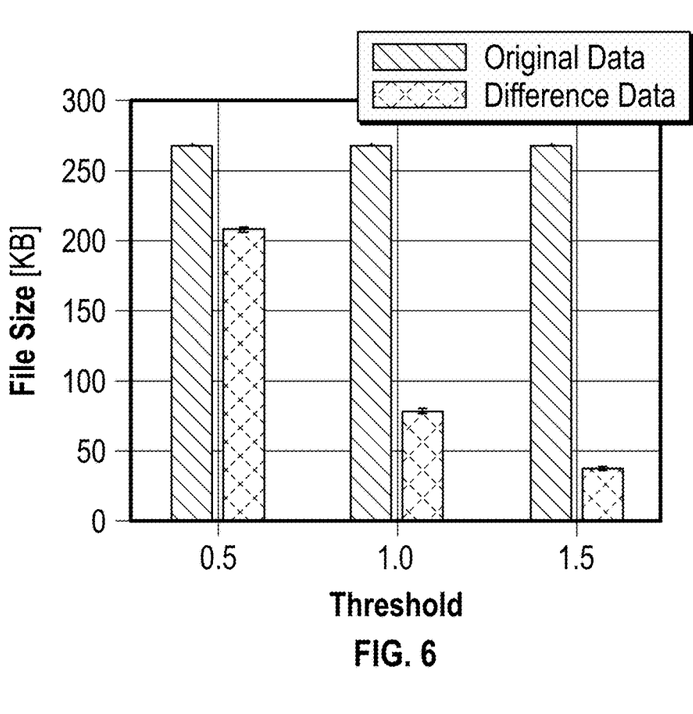
FIG. 6 shows exemplary file (data) size versus threshold, according to an aspect of the invention.

FIG. 5 shows sparsity versus threshold and FIG. 6 shows file (data) size versus threshold. The input data is the distance matrix in molecular dynamics, which represents distances between proteins (183×183*8 bytes=262 KB per frame). The threshold (tolerable error rate) indicates how much error is tolerable to draw (Angstrom for the example depicted). Sparsity is the number of zeros divided by the number of matrix cells; sparsity increases with the higher threshold, while Data (file) size decreases with higher sparsity. Thus, the higher the sparsity, the smaller the file size, and hence, the less data to load. In such applications, the consecutive image frames have high similarity, leading to very small diff data with very high sparsity. Therefore, a very low volume of data communication can be achieved. The volume can be reduced even more by employing the higher threshold within the range of tolerable error.

Thus, it will be appreciated that large scale neural network training requires a large stream of input data, leading to frequent raw data communications exceeding ~TB size, e.g., video frames for moving objects, and molecular dynamics. It is known to separate input data into baseline data and difference data to eliminate similarities, where the baseline data is transmitted infrequently, but the low-volume difference data is sent frequently. Though this achieves significant reduction in communication cost, this requires an explicit recovery process by merging the baseline and difference data; advantageously, one or more embodiments do not require or employ such an explicit decompression process.

Furthermore, one or more embodiments provide an efficient training hardware system using an array of resistive processor units (RPUs) for streamed input images with high similarity between frames. Base and differential data can be applied to the array simultaneously during the training by having two separate pulse generators per word line for baseline and difference data. As noted, unlike conventional digital implementations, an architecture according to one or more embodiments does not require explicit recovery of the original data.

In one or more embodiments, weights are stored in the array to be trained. As noted elsewhere herein, the stochastic translators 295, 297 convert the input data in the registers 265 to a stochastic stream of high and low. Then, the stochastic pulse generators 705, 707 just drive the WLs 701 based on the output of the stochastic translators (stream of high/low); i.e., not directly using the input data any more. Thus, the pulse generators do not use the base/diff input data per se, but rather the outputs of the stochastic translators. Stated in another way, as shown, the data A, B comes to the register, and then the translator uses the value to create a stream of high and low, and then the stream goes to the pulse generator, which drives the word lines (WL). Diff data is received every cycle, while base data is received every $n^{th}$ cycle. The learning rate can be controlled by modulating the update enabling signal's pulse width (BL).

Thus, one or more embodiments provide methods and circuits for the efficient hardware-based training of neural networks with resistive processor units (RPUs) for streamed input images with high similarity between frames, or similar data.

It will be appreciated that while an exemplary use case is set forth in the context of an update process during training, the key computing kernels of forward and inference are also matrix multiplication. For example, between (voltage) vector X and (matrix, e.g., weight) W, it may be necessary to compute X*W. In a non-limiting use case, during inferencing, a stream of video frames could be received to find the location of a target. In such a case, a similar technique could be employed by decomposing vector X into "X_base+X_diff" to save on communication costs.

Figure 7:
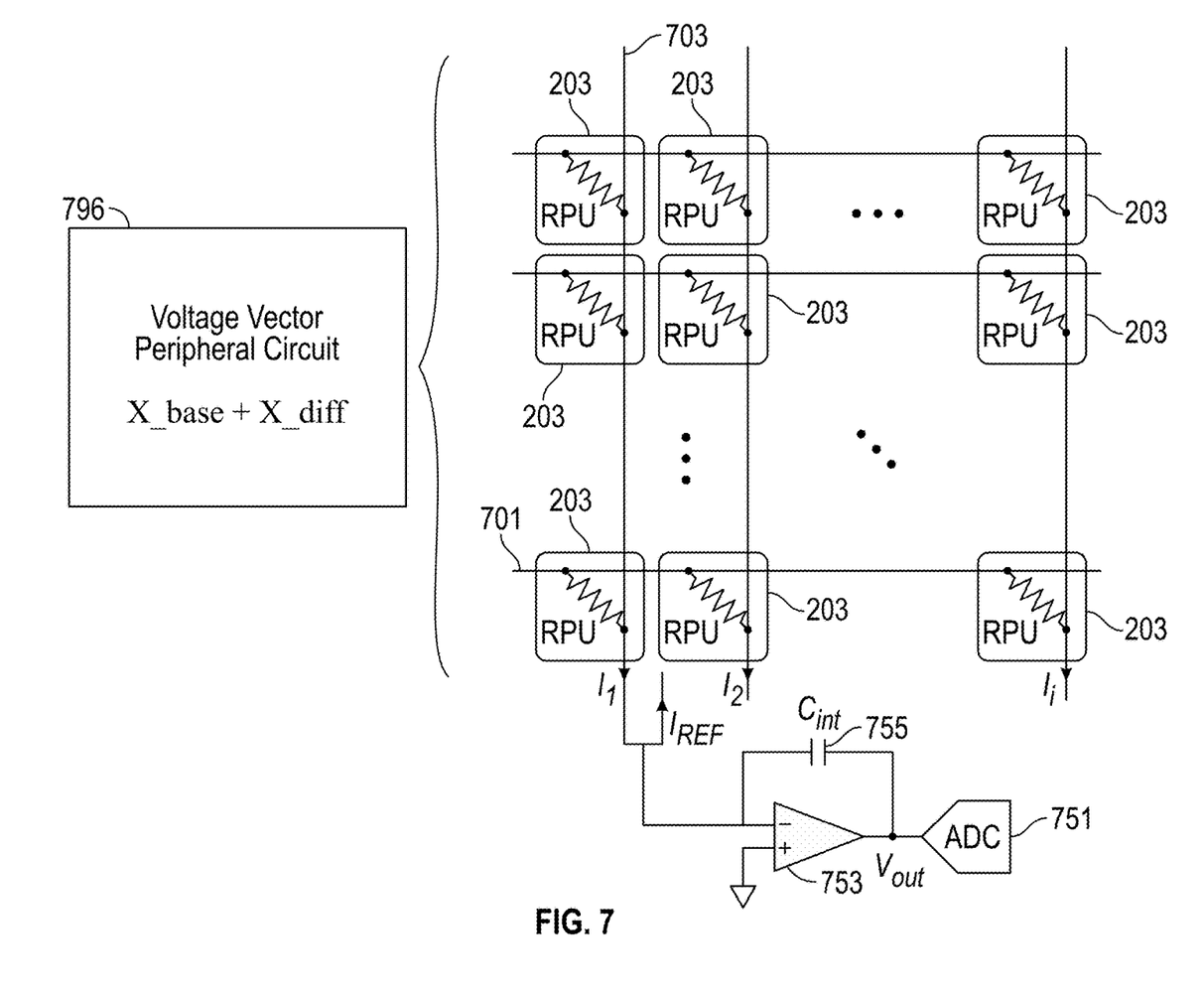
FIG. 7 shows the array of FIG. 2 during an exemplary inferencing process, according to an aspect of the invention.

An exemplary inference process is shown in FIG. 7. During the inference, the stored values of the RPU bit cells 203 are not changed. Input X_base+X_diff from voltage vector peripheral circuit 796 to the word lines 701, and simply measure the current at the bottom of the bitlines 703 with the integrator (op-amp 753 and capacitor 755) and analog-to-digital converter (ADC) 751.

The skilled artisan will be familiar with conventional training and inferencing of RPU arrays from, for example, Gokmen T. and Vlasov Y., Acceleration of Deep Neural Network Training with Resistive Cross-Point Devices: Design Considerations, Front. Neurosci. 10:333, doi: 10.3389/fnins.2016.00333, 21 Jul. 2016 and Gokmen T., Onen M. and Haensch W., Training Deep Convolutional Neural Networks with Resistive Cross-Point Devices, Front. Neurosci. 11:538. doi: 10.3389/fnins.2017.00538, 10 Oct. 2017.

Given the discussion thus far, it will be appreciated that, in general terms, an exemplary electronic circuit, according to an aspect of the invention, includes a plurality of word lines 701; a plurality of bit lines 703 intersecting the plurality of word lines at a plurality of grid points; and a plurality of resistive processing units 203-1,1 . . . 203-2,2 located at the plurality of grid points. Also included are a plurality of baseline stochastic pulse input units 265 (i.e., those registers coupled to translators 297), 297, 705 coupled to the plurality of word lines; a plurality of differential stochastic pulse input units 265 (i.e., those registers coupled to translators 295), 295, 707 coupled to the plurality of word lines; and a plurality of bitline stochastic pulse input units 265 (i.e., those registers coupled to translators 299), 299, 298 coupled to the plurality of bit lines. Further included is control circuitry 279 coupled to the plurality of baseline stochastic pulse input units, the plurality of differential stochastic pulse input units, and the plurality of bitline stochastic pulse input units and configured to cause each of the baseline stochastic pulse input units to generate a baseline pulse train using base input data, each of the differential stochastic pulse input units to generate a differential pulse train using differential input data defining differences from the base input data, and each of the bitline stochastic pulse input units to generate a bitline pulse train using bitline input data.

In one or more embodiments, the control circuitry controls the plurality of baseline stochastic pulse input units, the plurality of differential stochastic pulse input units, and the plurality of bitline stochastic pulse input units to store neural network weights in the plurality of resistive processing units. In one or more embodiments, whatever the application is, the weights are simply the numbers obtained from the iterative training machine learning process to make an accurate final decision, e.g., whether an image is a human or a cat; whether a cell is a cancer cell or a normal cell, and so on. Once the weights are obtained, the weights can be used (i.e., during inferencing) for the application by multiplying the numbers with input image values during matrix multiplication or convolutions. Inferencing can thus be carried out, for example, to recognize images. Suitable action can be taken based on the recognized images; for example, controlling an autonomous vehicle, a robotic surgical device, or the like.

In one or more embodiments, the plurality of baseline stochastic pulse input units each comprise a baseline register (i.e., those registers coupled to translators 297) configured to store a corresponding portion of the base input data, a baseline stochastic translator 297 coupled to the baseline register, and a baseline pulse generator 705 coupled to the baseline stochastic translator and a corresponding one of the word lines; the plurality of differential stochastic pulse input units each comprise a differential register (i.e., those registers coupled to translators 295) configured to store a corresponding portion of the differential input data, a differential stochastic translator 295 coupled to the differential register, and a differential pulse generator 707 coupled to the differential stochastic translator and the corresponding one of the word lines 701; and the plurality of bitline stochastic pulse input units each comprise a bitline register (i.e., those registers coupled to translators 299) configured to store a corresponding portion of the bitline input data, a bitline stochastic translator 299 coupled to the bitline register, and a bitline pulse generator 298 coupled to the bitline stochastic translator and a corresponding one of the bit lines 703.

In one or more embodiments, the baseline stochastic translators 297 are configured to convert baseline data in the baseline registers to baseline output stochastic streams of high and low, and the baseline pulse generators 705 are configured to drive the word lines based on the baseline output; the differential stochastic translators 295 are configured to convert differential data in the differential registers to differential output stochastic streams of high and low, and the differential pulse generators 707 are configured to drive the word lines based on the differential output; and the bitline stochastic translators 299 are configured to convert bitline data in the bitline registers to bitline output stochastic streams of high and low, and the bitline pulse generators 298 are configured to drive the bit lines based on the bitline output.

In one or more embodiments, the electronic circuit is implemented as an integrated circuit chip 263, and further includes an on-chip memory 269 (e.g., a random-access memory (RAM) such as, for example, an SRAM (static RAM)) coupled to the registers 265 and including an interface (I/F) to off-chip storage/external memory 267 (in a non-limiting example, a Solid-State Drive (SSD)).

In one or more embodiments, the diff data is received every cycle; while the base data is received every $n^{th}$ cycle. In one or more embodiments, whenever new input data is received from the external devices (such as an SSD), such data is usually stored in the on-chip temporal storage devices 269, e.g., RAM (in a non-limiting example, SRAM). However, during the (update/training) computations, the data is moved even closer to the RPU core, e.g., into the registers. The values are stored in the registers, and the base register is not frequently updated.

In the update equation 201, the bitline data is "delta (S)." The delta result comes from the previous back propagation process, and is stored in the on-chip storage devices 269, and moved to registers 265 near the RPU core during the update process. However, in one or more embodiments, this delta is not updated frequently. The delta is re-used for many new inputs, via so-called "batch-based" processing.

As discussed elsewhere, the learning rate can be controlled by modulating the update enabling signal's pulse width (BL). Thus, in one or more embodiments, the control circuitry is configured to control an update time by controlling length of a stochastic bit stream (see BL for first and second cycles in FIG. 3) at outputs of the differential stochastic translators.

In one or more embodiments, referring to FIG. 7, the electronic circuit further includes a voltage vector peripheral circuit 796 coupled to the plurality of word lines and a plurality of integrators (e.g., 751, 753, 755) coupled to the plurality of bit lines. The control circuitry controls the voltage vector peripheral circuit and the plurality of integrators to carry out inferencing with the plurality of resistive processing units having the neural network weights stored therein. Suitable integration techniques are known, for example, from the above-mentioned Gokmen et al. papers.

In one or more embodiments, the control circuitry controls the voltage vector peripheral circuit to input a voltage vector to the plurality of word lines as baseline data plus differential data X_base+X_diff.

Given the teachings herein, the skilled artisan can implement the circuits herein using known integrated circuit fabrication techniques. Considering the different states of the cells and how they are programmed, overlapping the signal(s) will update the weight in an incremental fashion. Two independent random number generators for column and row are sufficient in one or more embodiments.

In another aspect, an exemplary method for training a computer-implemented neural network, includes providing an electronic circuit as described above (alternatively, instead of an explicit providing step, the circuit is a workpiece on which the method operates). The method includes (e.g., with the control circuitry) causing each of the baseline stochastic pulse input units to generate a baseline pulse train using base input data, each of the differential stochastic pulse input units to generate a differential pulse train using differential input data defining differences from the base input data, and each of the bitline stochastic pulse input units to generate a bitline pulse train using bit line input data.

In one or more embodiments, the method further includes (e.g., with the control circuitry) controlling the plurality of baseline stochastic pulse input units, the plurality of differential stochastic pulse input units, and the plurality of bitline stochastic pulse input units to store neural network weights in the plurality of resistive processing units.

In one or more embodiments, in the providing step (or alternatively, in the workpiece on which the method operates), the plurality of baseline stochastic pulse input units each comprise a baseline register configured to store a corresponding portion of the base input data, a baseline stochastic translator coupled to the baseline register, and a baseline pulse generator coupled to the baseline stochastic translator and a corresponding one of the word lines; the plurality of differential stochastic pulse input units each comprise a differential register configured to store a corresponding portion of the differential input data, a differential stochastic translator coupled to the differential register, and a differential pulse generator coupled to the differential stochastic translator and the corresponding one of the word lines; and the plurality of bitline stochastic pulse input units each comprise a bitline register configured to store a corresponding portion of the bitline input data, a bitline stochastic translator coupled to the bitline register, and a bitline pulse generator coupled to the bitline stochastic translator and a corresponding one of the bit lines. The method further includes, with the baseline stochastic translators, converting baseline data in the baseline registers to baseline output stochastic streams of high and low; with the baseline pulse generators, driving the word lines based on the baseline output; with the differential stochastic translators, converting differential data in the differential registers to differential output stochastic streams of high and low; with the differential pulse generators, driving the word lines based on the differential output; with the bitline stochastic translators, converting bitline data in the bitline registers to bitline output stochastic streams of high and low; and with the bitline pulse generators, driving the bit lines based on the bitline output.

One or more embodiments further include (e.g., with the control circuitry) controlling an update time by controlling a length of a stochastic bit stream at outputs of the differential stochastic translators.

Referring to FIG. 7, in one or more embodiments, in the providing step (or alternatively, in the workpiece on which the method operates), the electronic circuit further includes a voltage vector peripheral circuit coupled to the plurality of word lines and a plurality of integrators coupled to the plurality of bit lines. A further step includes (e.g., with the control circuitry), controlling the voltage vector peripheral circuit and the plurality of integrators to carry out inferencing with the plurality of resistive processing units having the neural network weights stored therein.

Still referring to FIG. 7, one or more embodiments further include (e.g., with the control circuitry), controlling the voltage vector peripheral circuit to input the voltage vector to the plurality of word lines as baseline data plus differential data.

Figure 8:
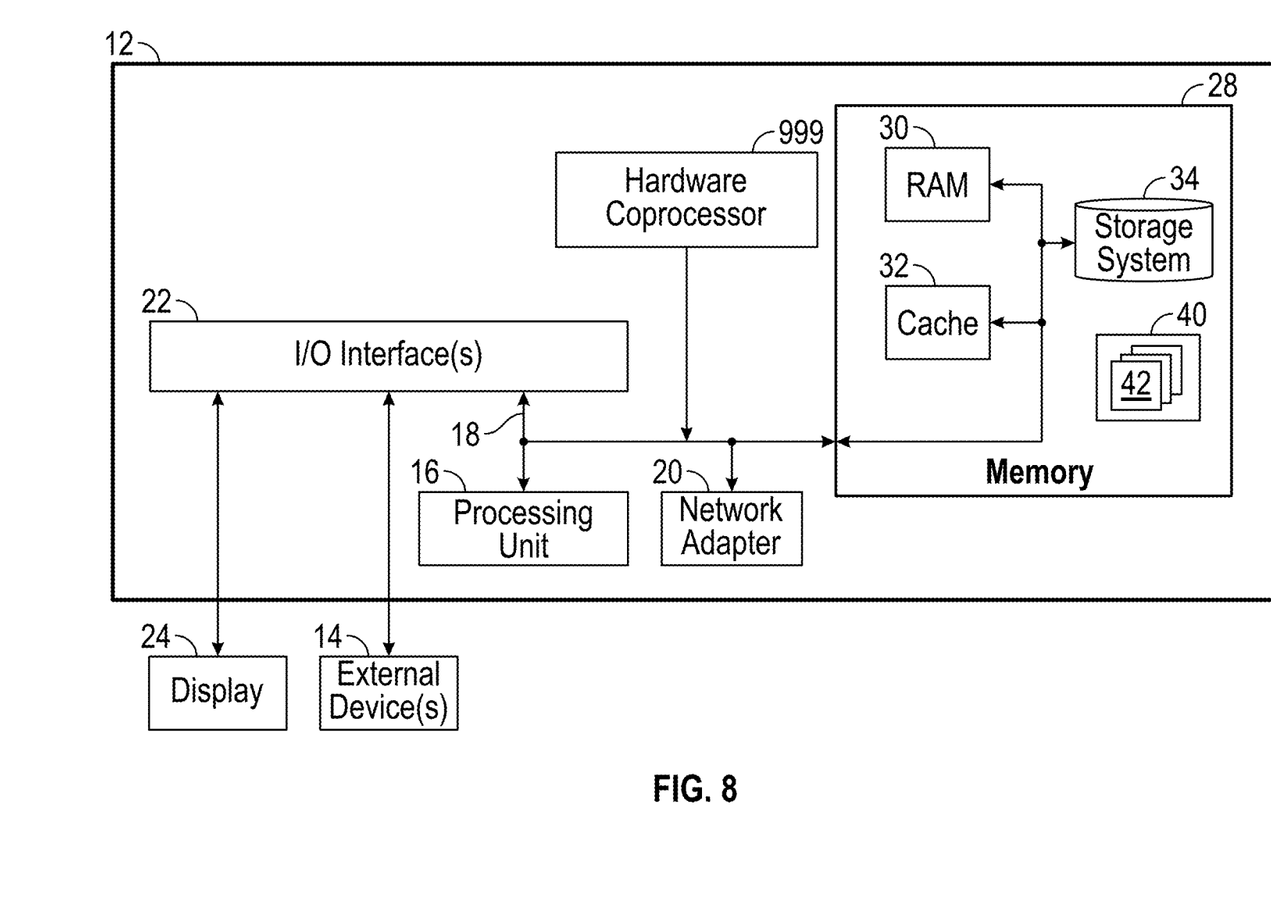
FIG. 8 depicts a computer system that uses a coprocessor in accordance with aspects of the invention, suitable for accelerating neural network implementation and the like (also representative of a general-purpose computer that could implement a design process such as that shown in FIG. 9)

Referring to FIG. 8, some aspects of the invention can be implemented as a hardware coprocessor 999 that uses the specialized hardware techniques to accelerate training (optionally inferencing) for neural networks or the like. FIG. 8 depicts a computer system 12 including such a hardware coprocessor. Computer system 12 includes, for example, one or more conventional processors or processing units 16, a system memory 28, and a bus 18 that couples various system components including system memory 28 and one or more hardware coprocessors 999 to processor 16. The elements 999 and 16 can connect to the bus, for example, with suitable bus interface units.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below memory 28 may include at least one program product having a set (e.g., at least one) of program modules that are configured to carry out, e.g., software-implemented portions of a neural network or digital filter.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out software-implemented functions and/or methodologies.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Still with reference to FIG. 8, note processor 16, memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry (e.g., 999). Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, coprocessor 999, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing desired tasks, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 8) running a server program. It will be understood that such a physical server may or may not include a display and keyboard. Furthermore, FIG. 8 is also representative of a conventional general-purpose computer (e.g., without co-processor 999) that could be used, for example, to implement aspects of the design process described below.

Exemplary Design Process Used in Semiconductor Design, Manufacture, and/or Test

Figure 9:
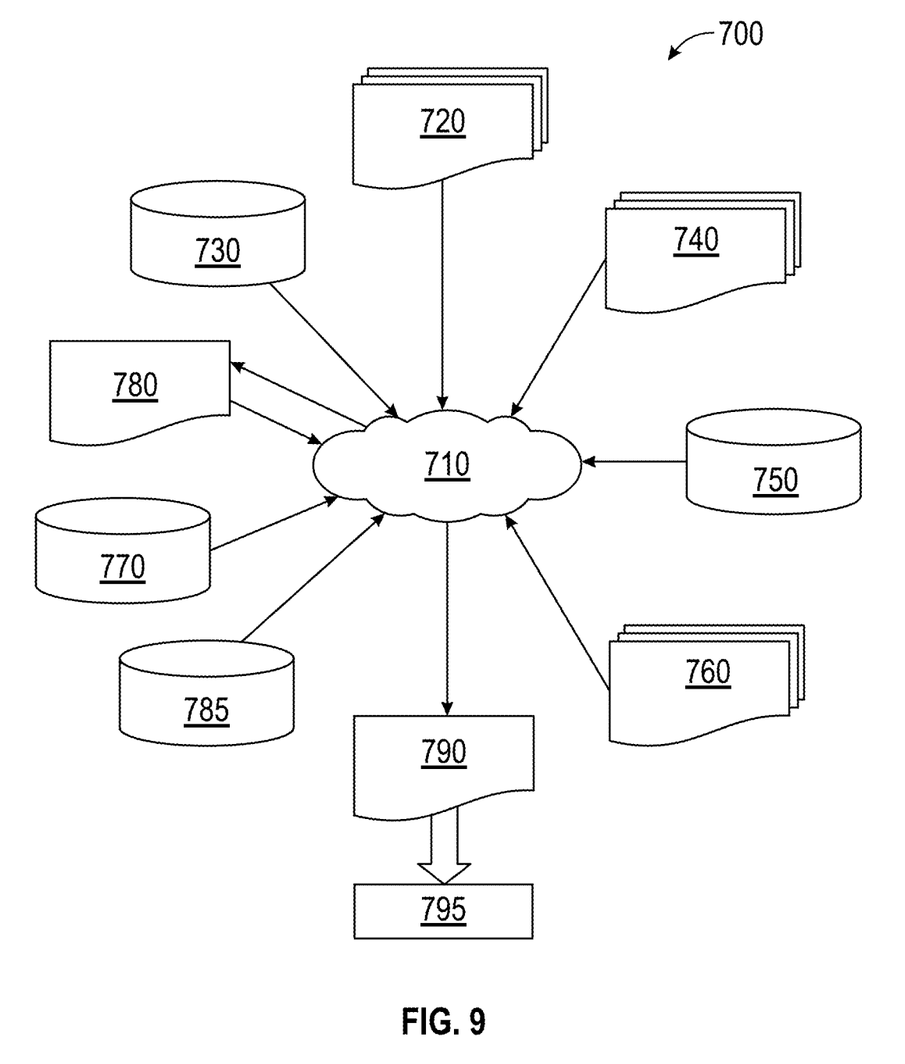
FIG. 9 is a flow diagram of a design process used in semiconductor design, manufacture, and/or test.

One or more embodiments of hardware in accordance with aspects of the invention can be implemented using techniques for semiconductor integrated circuit design simulation, test, layout, and/or manufacture. In this regard, FIG. 9 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like as disclosed herein. In one embodiment, design structure 790 may comprise a compiled, executable HDL simulation model that functionally simulates the devices disclosed herein.

Design structure 790 may also employ a data format used for the exchange of layout data of integrated circuits and/or symbolic data format (e.g., information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein. Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic circuit, comprising:
a plurality of word lines;
a plurality of bit lines intersecting said plurality of word lines at a plurality of grid points;
a plurality of resistive processing units located at said plurality of grid points;
a plurality of baseline stochastic pulse input units coupled to said plurality of word lines;
a plurality of differential stochastic pulse input units coupled to said plurality of word lines;
a plurality of bitline stochastic pulse input units coupled to said plurality of bit lines; and
control circuitry coupled to said plurality of baseline stochastic pulse input units, said plurality of differential stochastic pulse input units, and said plurality of bitline stochastic pulse input units and configured to cause each of said baseline stochastic pulse input units to generate a baseline pulse train using base input data, each of the differential stochastic pulse input units to generate a differential pulse train using differential input data defining differences from said base input data, and each of said bitline stochastic pulse input units to generate a bitline pulse train using bitline input data.

2. The electronic circuit of claim 1, wherein said control circuitry controls said plurality of baseline stochastic pulse input units, said plurality of differential stochastic pulse input units, and said plurality of bitline stochastic pulse input units to store neural network weights in said plurality of resistive processing units.

3. The electronic circuit of claim 2, wherein:
said plurality of baseline stochastic pulse input units each comprise a baseline register configured to store a corresponding portion of said base input data, a baseline stochastic translator coupled to said baseline register, and a baseline pulse generator coupled to said baseline stochastic translator and a corresponding one of said word lines;
said plurality of differential stochastic pulse input units each comprise a differential register configured to store a corresponding portion of said differential input data, a differential stochastic translator coupled to said differential register, and a differential pulse generator coupled to said differential stochastic translator and said corresponding one of said word lines; and
said plurality of bitline stochastic pulse input units each comprise a bitline register configured to store a corresponding portion of said bitline input data, a bitline stochastic translator coupled to said bitline register, and a bitline pulse generator coupled to said bitline stochastic translator and a corresponding one of said bit lines.

4. The electronic circuit of claim 3, wherein:
said baseline stochastic translators are configured to convert baseline data in said baseline registers to baseline output stochastic streams of high and low, and said baseline pulse generators are configured to drive said word lines based on said baseline output;
said differential stochastic translators are configured to convert differential data in said differential registers to differential output stochastic streams of high and low, and said differential pulse generators are configured to drive said word lines based on said differential output; and
said bitline stochastic translators are configured to convert bitline data in said bitline registers to bitline output stochastic streams of high and low, and said bitline pulse generators are configured to drive said bit lines based on said bitline output.

5. The electronic circuit of claim 4, wherein said electronic circuit is implemented as an integrated circuit chip, further comprising an on-chip random access memory coupled to said register and including an interface to off-chip storage.

6. The electronic circuit of claim 5, wherein said control circuitry is configured to control an update time by controlling length of a stochastic bit stream at outputs of said differential stochastic translators.

7. The electronic circuit of claim 2, further comprising a voltage vector peripheral circuit coupled to the plurality of word lines and a plurality of integrators coupled to said plurality of bit lines, wherein said control circuitry controls said voltage vector peripheral circuit and said plurality of integrators to carry out inferencing with said plurality of resistive processing units having said neural network weights stored therein.

8. The electronic circuit of claim 7, wherein said control circuitry controls said voltage vector peripheral circuit to input a voltage vector to said plurality of word lines as baseline data plus differential data.

9. A method for training a computer-implemented neural network, comprising:
providing an electronic circuit, comprising:
a plurality of word lines;
a plurality of bit lines intersecting said plurality of word lines at a plurality of grid points;
a plurality of resistive processing units located at said plurality of grid points;
a plurality of baseline stochastic pulse input units coupled to said plurality of word lines;
a plurality of differential stochastic pulse input units coupled to said plurality of word lines;
a plurality of bitline stochastic pulse input units coupled to said plurality of bit lines; and
control circuitry coupled to said plurality of baseline pulse input units, said plurality of differential pulse input units, and said plurality of bitline stochastic pulse input units; and
with said control circuitry, causing each of said baseline stochastic pulse input units to generate a baseline pulse train using base input data, each of the differential stochastic pulse input units to generate a differential pulse train using differential input data defining differences from said base input data, and each of said bitline stochastic pulse input units to generate a bitline pulse train using bit line input data.

10. The method of claim 9 further comprising, with said control circuitry, controlling said plurality of baseline stochastic pulse input units, said plurality of differential stochastic pulse input units, and said plurality of bitline stochastic pulse input units to store neural network weights in said plurality of resistive processing units.

11. The method of claim 10, wherein, in said providing step:
said plurality of baseline stochastic pulse input units each comprise a baseline register configured to store a corresponding portion of said base input data, a baseline stochastic translator coupled to said baseline register, and a baseline pulse generator coupled to said baseline stochastic translator and a corresponding one of said word lines;

said plurality of differential stochastic pulse input units each comprise a differential register configured to store a corresponding portion of said differential input data, a differential stochastic translator coupled to said differential register, and a differential pulse generator coupled to said differential stochastic translator and said corresponding one of said word lines; and said plurality of bitline stochastic pulse input units each comprise a bitline register configured to store a corresponding portion of said bitline input data, a bitline stochastic translator coupled to said bitline register, and a bitline pulse generator coupled to said bitline stochastic translator and a corresponding one of said bit lines;

further comprising:
with said baseline stochastic translators, converting baseline data in said baseline registers to baseline output stochastic streams of high and low;
with said baseline pulse generators, driving said word lines based on said baseline output;
with said differential stochastic translators, converting differential data in said differential registers to differential output stochastic streams of high and low;
with said differential pulse generators, driving said word lines based on said differential output;
with said bitline stochastic translators, converting bitline data in said bitline registers to bitline output stochastic streams of high and low; and
with said bitline pulse generators, driving said bit lines based on said bitline output.

12. The method of claim 11, further comprising, with said control circuitry, controlling an update time by controlling a length of a stochastic bit stream at outputs of said differential stochastic translators.

13. The method of claim 10, wherein, in said providing step, said electronic circuit further comprises a voltage vector peripheral circuit coupled to the plurality of word lines and a plurality of integrators coupled to said plurality of bit lines, further comprising, with said control circuitry, controlling said voltage vector peripheral circuit and said plurality of integrators to carry out inferencing with said plurality of resistive processing units having said neural network weights stored therein.

14. The method of claim 13, further comprising, with said control circuitry, controlling said voltage vector peripheral circuit to input said voltage vector to said plurality of word lines as baseline data plus differential data.

15. A hardware description language (HDL) design structure encoded on a machine-readable data storage medium, said HDL design structure comprising elements that when processed in a computer-aided design system generates a machine-executable representation of an apparatus, wherein said HDL design structure comprises:
a plurality of word lines;
a plurality of bit lines intersecting said plurality of word lines at a plurality of grid points;
a plurality of resistive processing units located at said plurality of grid points;
a plurality of baseline stochastic pulse input units coupled to said plurality of word lines;
a plurality of differential stochastic pulse input units coupled to said plurality of word lines;
a plurality of bitline stochastic pulse input units coupled to said plurality of bit lines; and control circuitry coupled to said plurality of baseline stochastic pulse input units, said plurality of differential stochastic pulse input units, and said plurality of bitline stochastic pulse input units and configured to cause each of said baseline stochastic pulse input units to generate a baseline pulse train using base input data, each of the differential stochastic pulse input units to generate a differential pulse train using differential input data defining differences from said base input data, and each of said bitline stochastic pulse input units to generate a bitline pulse train using bitline input data.

16. The HDL design structure of claim 15, wherein:
said plurality of baseline stochastic pulse input units each comprise a baseline register configured to store a corresponding portion of said base input data, a baseline stochastic translator coupled to said baseline register, and a baseline pulse generator coupled to said baseline stochastic translator and a corresponding one of said word lines;

said plurality of differential stochastic pulse input units each comprise a differential register configured to store a corresponding portion of said differential input data, a differential stochastic translator coupled to said differential register, and a differential pulse generator coupled to said differential stochastic translator and said corresponding one of said word lines; and said plurality of bitline stochastic pulse input units each comprise a bitline register configured to store a corresponding portion of said bitline input data, a bitline stochastic translator coupled to said bitline register, and a bitline pulse generator coupled to said bitline stochastic translator and a corresponding one of said bit lines.

17. The HDL design structure of claim 16, wherein:
said baseline stochastic translators are configured to convert baseline data in said baseline registers to baseline output stochastic streams of high and low, and said baseline pulse generators are configured to drive said word lines based on said baseline output;
said differential stochastic translators are configured to convert differential data in said differential registers to differential output stochastic streams of high and low, and said differential pulse generators are configured to drive said word lines based on said differential output; and
said bitline stochastic translators are configured to convert bitline data in said bitline registers to bitline output stochastic streams of high and low, and said bitline pulse generators are configured to drive said bit lines based on said bitline output.

18. The HDL design structure of claim 17, further comprising an on-chip random access memory coupled to said register and including an interface to off-chip storage.

19. The HDL design structure of claim 18, wherein said control circuitry is configured to control an update time by controlling length of a stochastic bit stream at outputs of said differential stochastic translators.

20. The HDL design structure of claim 16, further comprising a voltage vector peripheral circuit coupled to the plurality of word lines and a plurality of integrators coupled to said plurality of bit lines, wherein said control circuitry controls said voltage vector peripheral circuit and said plurality of integrators to carry out inferencing with said plurality of resistive processing units having said neural network weights stored therein.

\* \* \* \* \*